US008237468B2

(12) United States Patent
Nguyen et al.

(10) Patent No.: US 8,237,468 B2
(45) Date of Patent: *Aug. 7, 2012

(54) DRIVER CALIBRATION METHODS AND CIRCUITS

(75) Inventors: Huy M. Nguyen, San Jose, CA (US); Vijay Gadde, Cupertino, CA (US); Sivakumar Doraiswamy, San Jose, CA (US)

(73) Assignee: Rambus Inc., Sunnnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/849,177

(22) Filed: Aug. 3, 2010

(65) Prior Publication Data

US 2010/0318311 A1  Dec. 16, 2010

Related U.S. Application Data

(60) Continuation of application No. 12/151,614, filed on May 7, 2008, now Pat. No. 7,808,278, which is a division of application No. 11/176,876, filed on Jul. 6, 2005, now Pat. No. 7,389,194.

(51) Int. Cl.
   *H03K 19/0175* (2006.01)
(52) U.S. Cl. ........... 326/82; 326/30; 326/83; 326/87; 327/109; 327/112; 330/255
(58) Field of Classification Search ............ 326/30, 326/82–83, 86–87; 327/108–109, 112; 330/252, 330/255
   See application file for complete search history.

(56) References Cited

U.S. PATENT DOCUMENTS

| 4,513,427 | A | 4/1985 | Borriello | 375/110 |
|---|---|---|---|---|
| 4,707,620 | A | 11/1987 | Sullivan et al. | 307/270 |
| 5,254,883 | A | 10/1993 | Horowitz | 307/443 |
| 5,298,800 | A | 3/1994 | Dunlop | 307/270 |
| 5,396,028 | A | 3/1995 | Tomassetti | 178/69 |
| 5,606,275 | A | 2/1997 | Farhang et al. | 327/108 |
| 5,680,060 | A | 10/1997 | Banniza | 326/30 |
| 5,726,582 | A | 3/1998 | Hedberg | 326/30 |
| 5,748,554 | A | 5/1998 | Barth et al. | 326/83 |
| 5,864,506 | A | 1/1999 | Arcoleo et al. | 365/189.05 |
| 5,926,031 | A | 7/1999 | Wallace | 326/30 |
| 5,969,658 | A | 10/1999 | Naylor | 341/514 |
| 6,028,484 | A | 2/2000 | Cole | 330/295 |
| 6,052,035 | A | 4/2000 | Nolan | 331/74 |
| 6,064,224 | A | 5/2000 | Esch, Jr. | 326/30 |
| 6,177,810 | B1 | 1/2001 | Loeffler | 19/94 |
| 6,266,001 | B1 | 7/2001 | Fang | 341/144 |
| 6,288,564 | B1 | 9/2001 | Hedberg | 326/30 |
| 6,291,881 | B1 | 9/2001 | Yang | 257/723 |
| 6,297,759 | B1 | 10/2001 | Lewyn | 341/150 |
| 6,330,193 | B1 | 12/2001 | Yu | 365/189.05 |

(Continued)

OTHER PUBLICATIONS

Response to Rule 312 Communication, with mail date of Jul. 21, 2010, for U.S. Appl. No. 12/151,614. 2 pages.

(Continued)

*Primary Examiner* — Jason M Crawford
(74) *Attorney, Agent, or Firm* — Silicon Edge Law Group LLP; Arthur J. Behiel

(57) ABSTRACT

Described are amplifiers that facilitate high-speed communication with calibrated drive strength and termination impedance. Drivers and termination elements can be divided into a number N of parallel portions, one or more of which can be disabled and updated without interfering with signal (e.g., clock or data) transmission. Some embodiments identify inactive elements by examining incoming signals.

20 Claims, 8 Drawing Sheets

U.S. PATENT DOCUMENTS

| | | | |
|---|---|---|---|
| 6,344,765 B2 | 2/2002 | Taguchi | 327/333 |
| 6,411,122 B1 | 6/2002 | Mughal | 326/30 |
| 6,417,705 B1 * | 7/2002 | Tursi et al. | 327/158 |
| 6,418,500 B1 | 7/2002 | Gai | 710/305 |
| 6,420,899 B1 * | 7/2002 | Crittenden et al. | 326/30 |
| 6,424,170 B1 | 7/2002 | Raman | 326/30 |
| 6,442,644 B1 | 8/2002 | Gustavson et al. | 711/105 |
| 6,448,813 B2 | 9/2002 | Garlepp et al. | 326/83 |
| 6,462,581 B1 | 10/2002 | Davies et al. | 326/95 |
| 6,462,588 B2 | 10/2002 | Lau | 327/108 |
| 6,467,013 B1 | 10/2002 | Nizar | 711/1 |
| 6,489,837 B2 | 12/2002 | Schultz et al. | 327/541 |
| 6,495,997 B2 | 12/2002 | Hall et al. | 323/316 |
| 6,509,756 B1 | 1/2003 | Yu | 326/30 |
| 6,509,757 B1 | 1/2003 | Humphrey | 326/30 |
| 6,511,901 B1 | 1/2003 | Lam | 438/612 |
| 6,525,558 B2 | 2/2003 | Kim | 326/30 |
| 6,530,062 B1 | 3/2003 | Liaw et al. | 716/2 |
| 6,531,784 B1 | 3/2003 | Shim | 257/777 |
| 6,545,522 B2 | 4/2003 | Mughal | 327/334 |
| 6,573,746 B2 | 6/2003 | Kim | 326/30 |
| 6,573,747 B2 | 6/2003 | Radhakrishnan | 326/30 |
| 6,583,659 B1 * | 6/2003 | Kwong et al. | 327/295 |
| 6,597,298 B2 | 7/2003 | Kim | 341/111 |
| 6,606,004 B2 | 8/2003 | Staszewski | 331/17 |
| 6,608,507 B2 | 8/2003 | Garrett, Jr. | 327/333 |
| 6,643,787 B1 | 11/2003 | Zerbe | 713/400 |
| 6,661,250 B2 | 12/2003 | Kim | 326/30 |
| 6,711,073 B2 | 3/2004 | Martin | 365/198 |
| 6,717,455 B2 | 4/2004 | Mughal et al. | 327/378 |
| 6,734,702 B1 | 5/2004 | Ikeoku et al. | 17/16 |
| 6,762,620 B2 | 7/2004 | Jang et al. | 326/30 |
| 6,768,352 B1 | 7/2004 | Maher | 327/112 |
| 6,806,728 B2 | 10/2004 | Nguyen | 326/30 |
| 6,853,938 B2 | 2/2005 | Jeddeloh | 702/107 |
| 6,882,593 B2 | 4/2005 | Best | 365/233 |
| 6,937,055 B2 | 8/2005 | Roy et al. | 326/30 |
| 6,940,303 B2 | 9/2005 | Vargas | 326/30 |
| 6,980,020 B2 | 12/2005 | Best | 326/30 |
| 7,019,556 B2 | 3/2006 | Yoo | 326/30 |
| 7,058,533 B2 | 6/2006 | Jeddeloh | 702/107 |
| 7,151,390 B2 | 12/2006 | Nguyen | 326/30 |
| 7,196,567 B2 | 3/2007 | Nguyen | 327/308 |
| 7,230,448 B2 | 6/2007 | Choe | 326/30 |
| 7,389,194 B2 | 6/2008 | Nguyen | 702/107 |
| 7,808,278 B2 * | 10/2010 | Nguyen et al. | 326/87 |
| 2001/0047450 A1 | 11/2001 | Gillingham et al. | 711/105 |
| 2004/0008054 A1 | 1/2004 | Lesea et al. | 326/30 |
| 2004/0044808 A1 | 3/2004 | Salmon | 710/8 |
| 2004/0124850 A1 | 7/2004 | Koneru | 324/601 |
| 2004/0222821 A1 | 11/2004 | Ho | 327/65 |
| 2005/0041683 A1 | 2/2005 | Kizer | 370/463 |
| 2006/0132171 A1 | 6/2006 | Nguyen | 326/30 |

OTHER PUBLICATIONS

Nakase, Yasunobu, et al., "Source-Synchronization and Timing Vernier Techniques for 1.2 GB/s SLDRAM Interface," IEEE Journal of Solid-State Circuits, vol. 34, No. 4, Apr. 1999, pp. 494-501.

"Hastings Rambus Asic Cell Specification Generic Implementation, Revision 0.1 Preliminary." Copyright 1999 Rambus Inc. Modified Jun. 20, 2000 149 pages.

Khouri, Gaby "Evaluation of Alcatel Patent Portfolio by Semiconductor Insights." Nov. 2004. Copyright Semiconductor Insights Inc. 38 pages.

Knight, Thomas F. Jr., "A Self-Terminating Low-Voltage Swing CMOS Output Driver." IEEE Journal of Solid-State Circuits, vol. 23, No. 2, Apr. 1988. pp. 457-464.

Paris et al., "WP 24.3: A 800 MB/s 72 Mb SLDRAM with Digitally-Calibrated DLL," ISSCC, 0-7803-5129-0/99, 10 pages. Slide Supplement, IEEE, 1999.

SLDRAM Inc., "400 Mb/s/pin SLDRAM" Draft/Advance, "4M × 18 SLDRAM, Pipelined, Eight Bank, 2.5V Operation." Rev. Jul. 9, 1998, pp. 1-69, Copyright 1998.

"Intel 430 TX PCISET:824395TX System Controller (MTXC)". Preliminary. Order No. 290559-001. Copyright Feb. 1997, Intel Corporation. 84 pages.

Gillingham, Peter, "SLDRAM Architectural and Functional Overview," Aug. 1997, pp. 1-14.

Babcock, J.A., "Precision Electrical Trimming of Very Low TCR Poly-SiGe Resistors." IEEE Electron Device Letters, vol. 21, No. 6, Jun. 2000. pp. 283-285.

Gabara, Thaddeus J., "On-Chip Terminating Resistors for High Speed ECL-CMOS Interfaces." Feb. 1992. IEEE. pp. 292-295.

Ware, Frederick A., "Direct RAC Data Sheet." Advance Information. Document DL0064, Version 1.11. Copyright Jul. 2000, Rambus Inc. 66 pages.

Micron, "Graphics DDR3 DRAM." Advance. "256 Mb × 32 GDDR3 DRAM." © 2003 Micron Technology, Inc. pp. 1-67.

Shah, Sunay et al., "A Temperature Independent Trimmable Current Source." Department of Engineering Science, University of Oxford. ISCAS 2002. 4 pages.

Ko, Hyoung-Soo, "Development of 3-Dimensional Memory Die Stack Packages Using Polymer Insulated Sidewall Technique." 1999 Electronic Components and Technology Conference. pp. 663-667.

Johnson, Chris. "The Future of Memory: Graphics DDR3 SDRAM Functionality." Micron Designline, vol. 11, Issue 4, 4Q02. 8 pages.

Gabara, Thaddeus J. et al., "Digitally Adjustable Resistors in CMOS for High-Performance Applications," IEEE Journal of Solid State Circuits, IEEE Inc. New York, US, vol. 27, No. 8, Aug. 1, 1992, pp. 1176-1185, XP000309397 ISSN: 0018-9200.

JEDEC Standard (JESD8-16) "Bus Interconnect Logic (BIC) for 1.2 Volts," Apr. 2004, 15 pages.

Al-Sarawi, Said F., "A Review of 3-D Packaging Technology." IEEE Transaction on Components, Packaging, and Manufacturing Technology-Part B, vol. 231, No. 1 Feb. 1998. pp. 2-14.

Johnson, Chris, "Graphics DDR3 On-Die Termination and Thermal Considerations." Micron Designline, vol. 12, Issue 1. Rev. Apr. 1, 2003. 1Q03/2Q03. 8 pages.

Gabara, Thaddeus J. et al., "A 200 MHz 100K ECL Output Buffer for CMOS ASICs." 1990 IEEE. pp. 4.

Kim, Su-Chul, "Programmable Digital On-Chip Terminator." ITC-CSCC, 2002. 4 pages.

"9Mb DDR SRAM, MT57V256H36P," pp. 1-23, Micron Technology, Inc., 2000.

"FB-DIMM draft Specification: High Speed Differential PTP Link at 1.5V", Revision 0.0, pp. 1-23, Intel Corporation Dec. 3, 2003.

"FB-DIMM Draft Specification: Architecture & Protocol," Revision 0.0, pp. 1-107, Intel Corporation, Dec. 3, 2003.

"Appendix X: Serial Presence Detect (SPD) for fully buffered DIMM," Revision 0.5, JEDEC Committee Ballot, JC-45 Item #2003.02, pp. 1-46, Aug. 18, 2004.

"Bus Interconnect Logic (BIC) for 1.2 volts," JEDEC Standard—JESD8-16A, JEDEC Solid State Technology Association, Nov. 2004 (26 pages).

Kim, Nam-Seog et al., "Programmable and Automatically Adjustable On-Die Terminator for DDR3-SRAM Interface,"IEEE Customs Integrated Circuits Conference, Sep. 2003.

Bazes, Mel, "Output buffer Impedance control and Noise Reduction Using a Speed-Locked Loop,"IEEE International Solid-State Circuits Conference, Feb. 2004.

"Xilinx Digitally Controlled Impedance (DCI) Technology," Xilinx, Inc., VTT011(v1.1), pp. 1-3, Sep. 20, 2001.

Nguyen, Huy M., pending patent application, U.S. Appl. No. 11/176,876, filed Jul. 6, 2005.

U.S. Non-Final Office Action with mail date Sep. 18, 2009 re U.S. Appl. No. 12/151,614, filed May 7, 2008. 12 pages.

Office Action with mail date of Jan. 14, 2010 re U.S. Appl. No. 12/151,614 including Notice of References Cited and IDS. 13 pages.

Response submitted Feb. 17, 2010 to Final Office Action of Jan. 14, 2010 re Amendment with RCE in U.S. Appl. No. 12/151,614. 5 Pages.

Amendment After Allowance and comments on Examiner's Reasons for Allowance dated Jun. 24, 2010 re U.S. Appl. No. 12/151,614. 6 Pages.

* cited by examiner

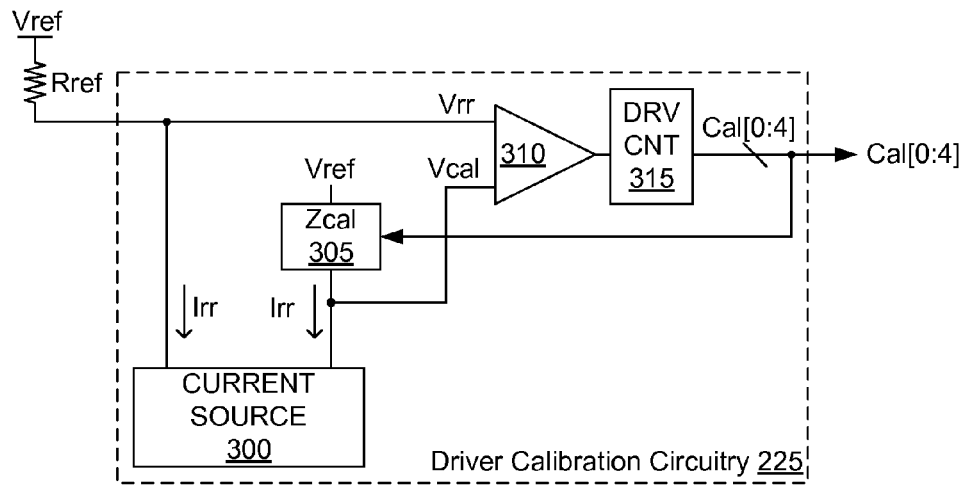
Fig. 3
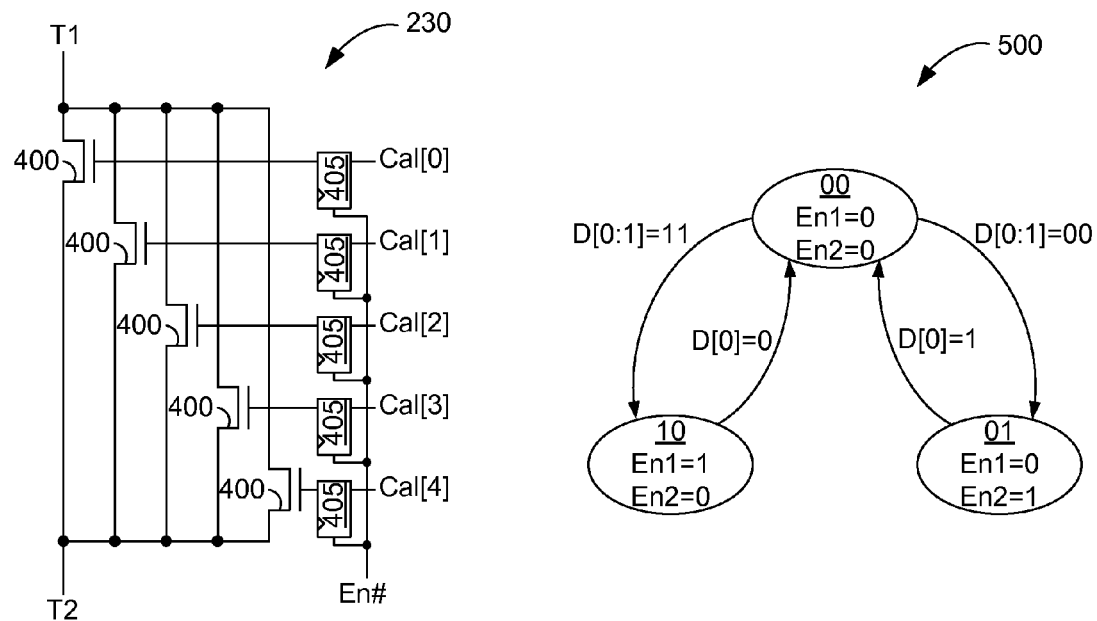
Fig. 4
Fig. 5

DRIVER CALIBRATION METHODS AND CIRCUITS

BACKGROUND

High-speed data communication systems are known to include current-mode driver amplifiers (drivers) and receivers. For best speed performance, the drive current should be calibrated. Such calibration should account for process variations, and is preferably repeated as needed to compensate for changes due to supply-voltage and temperature fluctuations.

Supply-voltage and temperature fluctuations occur during device operation, so driver recalibration is often desired of active (transmitting) drivers. Unfortunately, driver recalibration can introduce noise, and so is typically carried out on inactive drivers. Recalibration schemes either interrupt transmission or await a time when the driver is inactive. A better solution would allow for recalibration of active drivers without interrupting data transmission or introducing noise.

BRIEF DESCRIPTION OF THE FIGURES

FIG. 3 depicts impedance calibration circuitry 225 in accordance with one embodiment.

FIG. 4 depicts one of impedances 230 of FIG. 2 in accordance with one embodiment.

FIG. 5 depicts a state machine 500 illustrating the function of update logic 220 in accordance with one embodiment.

DETAILED DESCRIPTION

Figure 1:
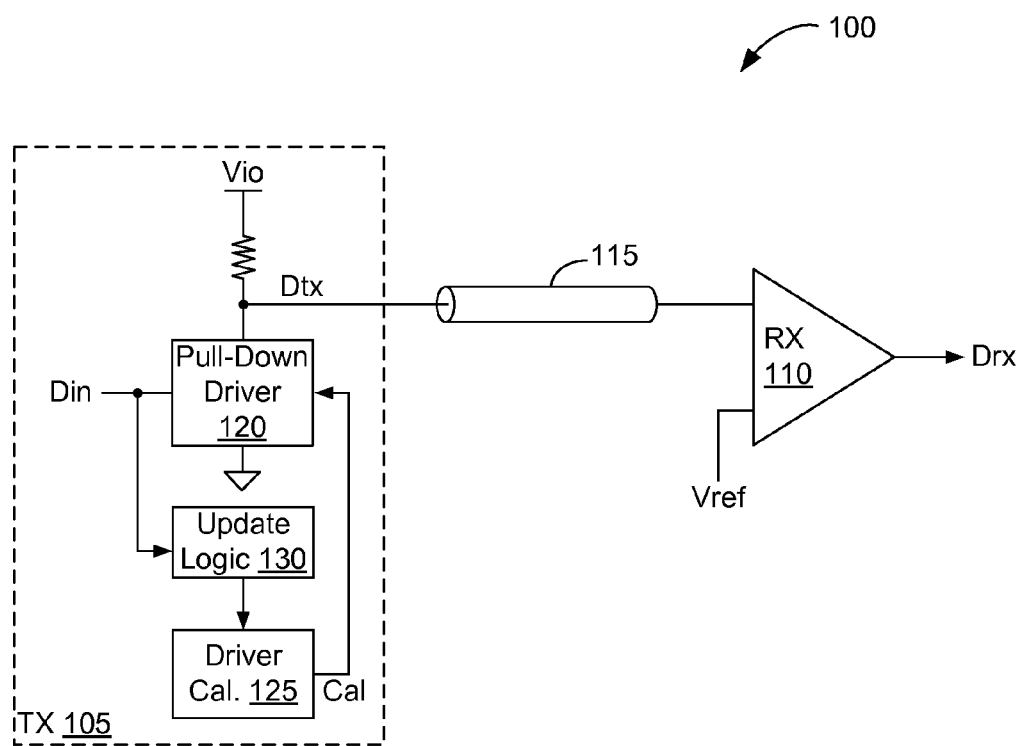
FIG. 1 is a block diagram of a data communication system 100 in accordance with one embodiment.

FIG. 1 is a block diagram of a data communication system 100 in accordance with one embodiment. Communication system 100 includes a transmitting amplifier 105 connected to a receiver 110 via a communication channel 115. Amplifier 105 includes a pull-down driver 120, the drive strength of which is calibrated by some driver calibration circuitry 125. Changing drive strength while driver 120 is in a low-impedance state can introduce undesirable glitches in the transmitted signal. To prevent such glitches, update logic 130 monitors incoming data Din on the corresponding input node to identify times during which driver 120 is inactive is in a high-impedance state and only then enables driver calibration circuitry 125 to recalibrate the drive strength of driver 120. Amplifier 105 can thus periodically adjust the drive strength of driver 120 to compensate for temperature and supply-voltage fluctuations without interrupting the transmission of data. As with other designations herein, each of Din, Dtx and Drx refer both to a signal and a corresponding node; whether a given designation refers to a signal or a node will be clear from the context.

Figure 2:
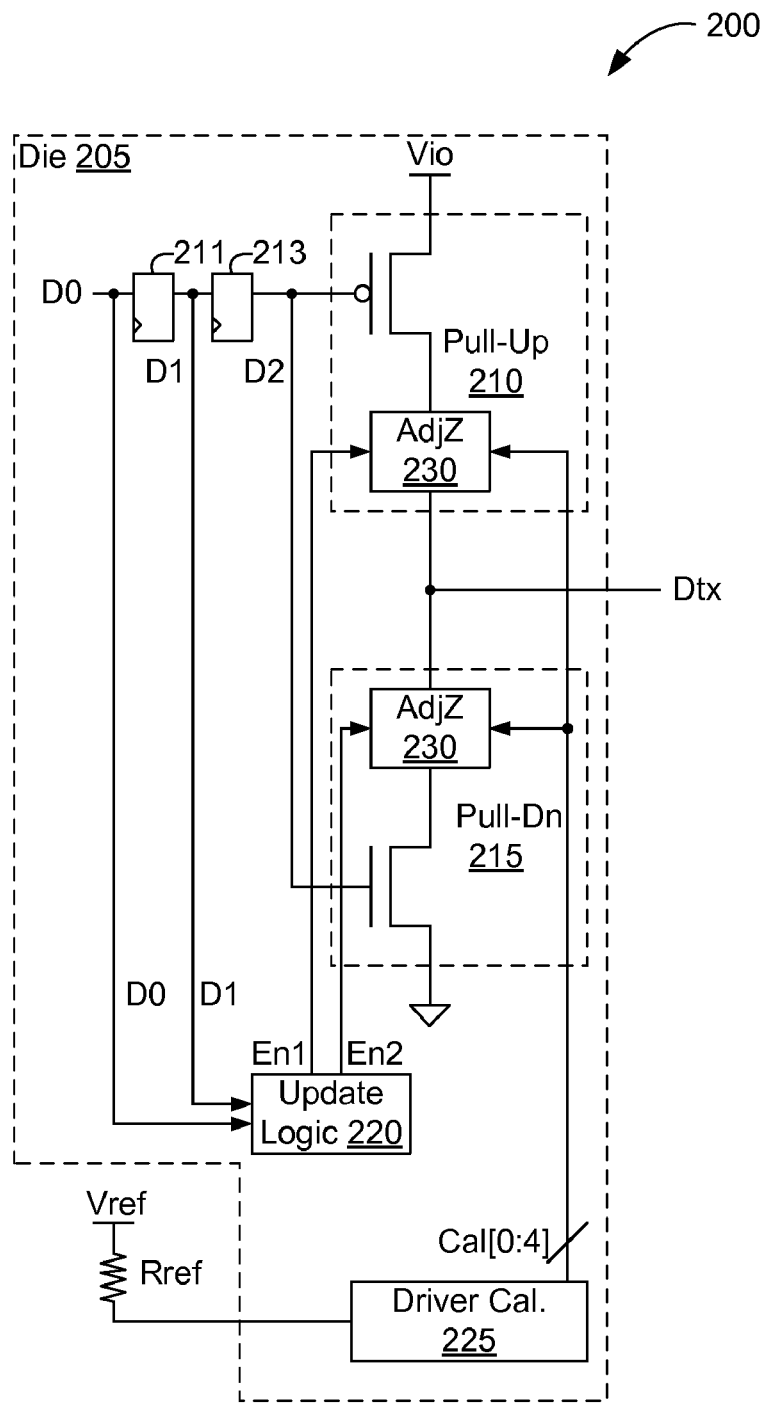
FIG. 2 depicts an amplifier 200 in accordance with another embodiment.

FIG. 2 depicts an amplifier 200 in accordance with another embodiment. The drive circuitry of amplifier 200 is instantiated on an integrated-circuit (IC) die 205 coupled to a reference voltage Vref via an external reference resistor Rref. The amplifier conveys data from an input node D0 to the control terminals of a pull-up driver 210 and a pull-down driver 215, which are coupled to the input node via a pair of sequential storage elements 211 and 213. Drivers 210 and 215 extend between an amplifier output node Dtx and respective supply terminals Vio and ground. While there may be some crossover, in general one of drivers 210 and 215 is active and the other inactive when transmitting data on output node Dtx. Amplifier 200 includes update logic 220 that monitors incoming data to schedule adjustments for the inactive driver. These adjustments are based upon calibration signals developed by some impedance calibration circuitry 225 coupled to the calibration ports of drivers 210 and 215.

Drivers 210 and 215 can be implemented in a number of configurations. In this example, each driver includes an adjustable impedance 230 coupled in series with a transistor between output node Dtx and the respective supply terminal. Each impedance 230 includes an enable port coupled to enable logic 220 and a calibration port Cal[0:4] coupled to impedance calibration circuitry 225. Update logic monitors two consecutive bits D0 and D1 of the incoming signal to identifying timing windows during which one of drivers 210 and 215 will be inactive, and then enables the respective impedance 230 of the inactive driver to receive the calibration signal Cal[0:4]. Update logic 220 uses two incoming bits to identify inactive drivers, but can use more or fewer bits in other embodiments. Update logic 220, impedance calibration circuitry, or both can also be enabled periodically in still other embodiments.

FIG. 3 depicts impedance calibration circuitry 225 in accordance with one embodiment. Calibration circuitry 225 includes a current source 300 that draws identical currents Irr through reference resistor Rref and a calibration impedance 305. The impedance through impedance 305 changes in response to calibration signal Cal[0:4] in a manner proportional to impedances 230 of FIG. 2, the proportion being one-to-one in some embodiments. A comparator 310 compares the voltage Vrr from reference resistor Rref with the voltage Vcal from impedance 305, causing a counter 315 to increment (decrement) when voltage Vrr is greater than (less than) calibration voltage Vcal. In this way, impedance calibration circuitry 225 maintains the proportion between impedance 305 and reference resistor Rref. Impedance 305 is similar to impedances 230, and so responds similarly to process, voltage, and temperature variations. The calibration signal required to maintain the desired proportionality between impedance 305 and reference resistor Rref can therefore be distributed to impedances 230 to similarly maintain their values.

FIG. 4 depicts one of impedances 230 of FIG. 2 in accordance with one embodiment. Impedance 230 includes a plurality of transistors 400 coupled between a pair of current-handling terminals T1 and T2. Transistors 400 are, in this example, coupled in parallel. The gate widths of transistors 400 are binary weighted to provide a range of 25 impedance values. The contents of five storage elements 405 determine which of transistors 400 is biased on. Each storage element 405 includes a enable terminal that allows update logic 220 of FIG. 2 to selectively direct calibration updates to inactive drivers. In one embodiment, calibration impedance 305 of FIG. 3 is identical to impedance 230, absent storage elements 405 and the associated enable terminal En#.

FIG. 5 depicts a state machine 500 illustrating the function of update logic 220 in accordance with one embodiment. Beginning in state 00, both enable signals En1 and En2 are at voltages expressing a logic zero. In that case, the storage elements within both impedances 230 are unable to capture updated calibration signals. Update logic 220 remains in state 00 until the incoming data symbols D0 and D1 are both ones or both zeros, in which case a sufficiently long update window exists for the one of impedances 230 not used to expresses the consecutive symbols. Assume, for example, that data bits D0 and D1 are both logic ones: in that case, update logic 220 transitions to state 10 on the next transmit clock edge and asserts enable signal En1. Impedance 230 within pull-up driver 210 then captures the current calibration signal Cal[0:4] on the next transmit clock edge, and is thus recalibrated. Update logic 220 remains in state 10 until data D0 is a zero, and then transitions back to state 00. Update logic 220 similarly updates pull-down driver 215, moving to state 01 when data symbols D0 and D1 are both zeros and back to state 00 when symbol D0 returns to a logic one.

Figure 6:
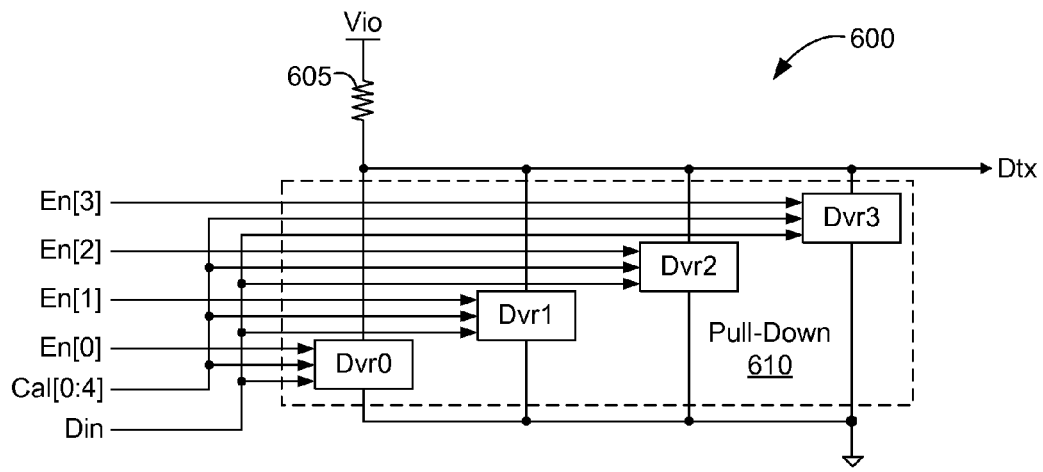
FIG. 6 depicts an amplifier 600 with a conventional pull-up resistor 605 and a pull-down driver 610 adapted in accordance with one embodiment.

FIG. 6 depicts an amplifier 600 with a conventional pull-up resistor 605 and a pull-down driver 610 adapted in accordance with one embodiment. Unlike the embodiments noted above, driver 610 is divided into a plurality (e.g. four) of drivers Dvr[0:3] coupled in parallel between output node Dtx and one supply terminal (ground). Incoming data Din and calibration signal Cal[0:4] are fed to each of drivers Dvr[0:3]. A collection of enable signals En[0:3], each coupled to an enable port of a respective one of drivers Dvr[0:3], allows external control circuitry to selectively enable the calibration feature of each driver.

Driver 610 can be adapted to support a number of calibration schemes that may or may not take into consideration the pattern of the incoming data. In one embodiment, for example, only three of the four drivers Dvr[0:3] are enabled at any one time, leaving the fourth to receive updated calibration signals Cal[0:4] without producing a glitch in the outgoing data. The newly calibrated driver can then substitute for one of the active drivers, at which time newly inactive driver is available for calibration. In this way, all the active drivers can be successively updated. In another embodiment all of the drivers may be active simultaneously, but the calibration port of only one or a subset is enabled at a time. In either case, driver 610 may be updated by successively updating less than all of drivers Dvr[0:3].

Figure 7:
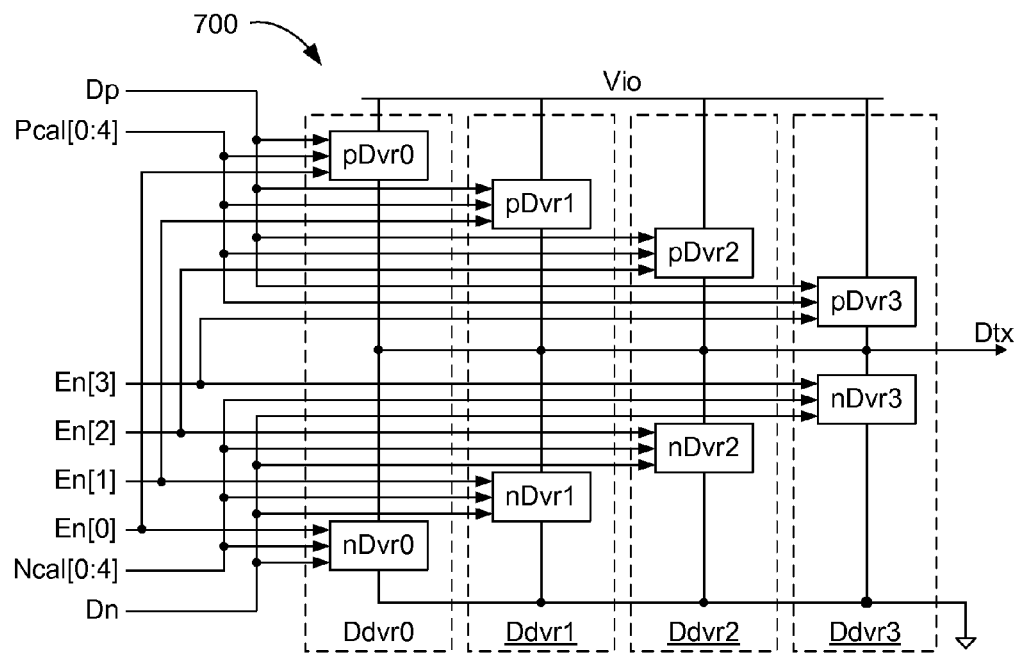
FIG. 7 depicts a push-pull amplifier 700 in accordance with another embodiment.

FIG. 7 depicts a push-pull amplifier 700 in accordance with another embodiment. Amplifier 700 is similar to amplifier 600 of FIG. 6, but uses calibrated pull-up drivers in place of resistor 605. Amplifier 700 is divided into a plurality of (e.g. four) drivers Ddvr[0:3] coupled in parallel between supply terminals Vio and ground. Data Dp/Dn and calibration signals Pcal[0:4] and Ncal[0:4] are fed to each of drivers Ddvr[0:3]. A collection of enable signals En[0:3], each coupled to an enable port of a respective one of drivers Ddvr[0:3], allows external control circuitry to selectively enable the calibration feature of each driver. Exemplary control circuitry is detailed below in connection with FIG. 8.

Each of drivers Ddvr[0:3] includes a pull-up driver and a pull-down driver. Driver Ddvr0, for example, includes a pull-up driver pDvr0 and a pull-down driver nDvr0. The pull-up drivers are activated by data signal Dp and are calibrated using calibration signals Pcal[0:4], whereas the pull-down drivers are activated by data signal Dn and are calibrated using calibration signals Ncal[0:4]. As with amplifier 600 of FIG. 6, amplifier 700 can be adapted to support a number of calibration schemes that may or may not take into consideration the pattern of the incoming data.

Figure 8:
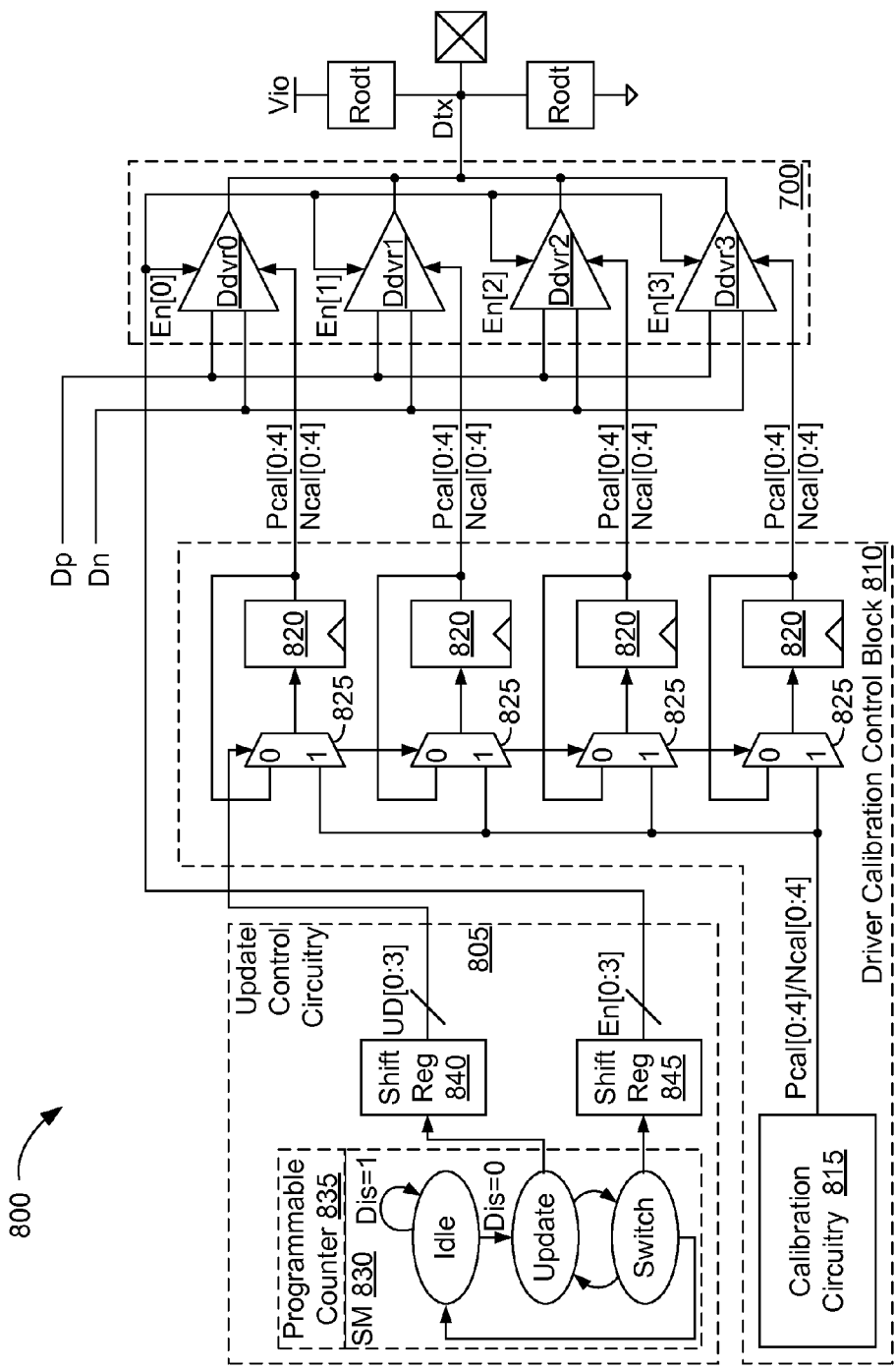
FIG. 8 depicts an amplifier 800 in accordance with an embodiment that includes push-pull amplifier 700 of FIG. 7 and, to update the drivers within amplifier 700, some update control circuitry 805 and a driver calibration block 810.

FIG. 8 depicts an amplifier 800 in accordance with an embodiment that includes push-pull amplifier 700 of FIG. 7 and, to update the drivers within amplifier 700, some update control circuitry 805 and a calibration control block 810. Calibration control block 810 includes calibration circuitry 815 that maintains impedance calibration signals Pcal[0:3] and Ncal[0:4] as needed to adjust the strengths of drivers Ddvr[0:3] to account for process, temperature, and supply voltage fluctuations. Calibration control block 810 additionally includes, for each driver, a register 820 and a multiplexer 825 that together apply driver-specific calibration signals to the drivers and facilitate driver-specific update control.

Update control circuitry 805 includes a state machine 830, an associated programmable counter 835, and a pair of shift registers 840 and 845. Update control circuitry 805 delivers update signals UD[0:3] to calibration control block 810 to select which driver is to be updated, and delivers enable signals En[0:3], one to each driver, to selectively enable the drivers. Amplifier 800 may include one or more fixed or adjustable on-die termination elements Rodt. The operation of amplifier 800 is described below in connection with the following Table 1.

TABLE 1

| Clock Tick Number | State | Update En UD[0:3] | Driver En EN[0:3] |
|---|---|---|---|
| 0 | Idle | 0000 | 1110 |
| n | Update | 0001 | 1110 |
| 2n | Switch | 0001 | 0111 |
| 3n | Update | 1000 | 0111 |
| 4n | Switch | 1000 | 1011 |
| 5n | Update | 0100 | 1011 |
| ‖ | ‖ | ‖ | ‖ |

State machine 830 can be disabled by asserting a disable signal (Dis=1), in which case state machine 830 remains in an idle state. Shift register 840 stores all zeroes in the Idle state, so the outputs of registers 820 are fed back to their respective inputs via multiplexers 825, preventing calibration updates to any of drivers Ddvr[0:3]. Shift register 845 stores ones and a single zero (e.g. 1110) in the Idle state so that all but one of the drivers are enabled. In the example of Table 1, the least-significant bits of UD[0:3] and EN[0:3] correspond to driver Ddvr0, so driver Ddvr0 is disabled.

State machine 830 enters the Update state when the disable signal is deasserted (Dis=0). The disable signal might be deasserted periodically, after a number of clock cycles n dictated by programmable counter 835, for example. A single logic one is loaded into the location of shift register 840 corresponding to the disabled driver Ddvr0, gating the output of calibration circuitry 815 to the one of registers 820 associated with driver Ddvr0. That register will therefore capture any changes to calibration signals Pcal[0:4] and Ncal[0:4] on the next clock cycle, and will apply the updated signals to driver Ddvr0.

After again waiting n clock cycles, state machine 830 transitions to state Switch. Shift register 845 shifts the stored zero one bit, thus enabling the recently updated driver Ddvr0 and disabling another (in this case, driver Ddvr3). State machine 830 will continue to vacillate between the update and switch states until the disable signal is asserted (Dis=1).

In the embodiment of FIG. 8, one driver of amplifier 800 is always inactive, and so can be calibrated without adversely impacting data being transmitted. Other embodiments operate in a manner similar to amplifier 105 of FIG. 1 and amplifier 200 of FIG. 2, in which case the incoming data Dp/Dn is monitored to find update windows during which pull-up or pull-down drivers within drivers Ddvr[0:3] are inactive.

Only four drivers are coupled in parallel in FIG. 8, though more or fewer may be used. In addition, the number of disabled drivers can be changed to provide coarse adjustment to the overall driver strength. The number of enabled drivers might be determined at start-up, for example, with shift registers 840 and 845 loaded with the appropriate numbers of ones and zeroes. The calibration process detailed above can then be applied as needed to compensate for changes in temperature and supply voltage.

Figure 9:
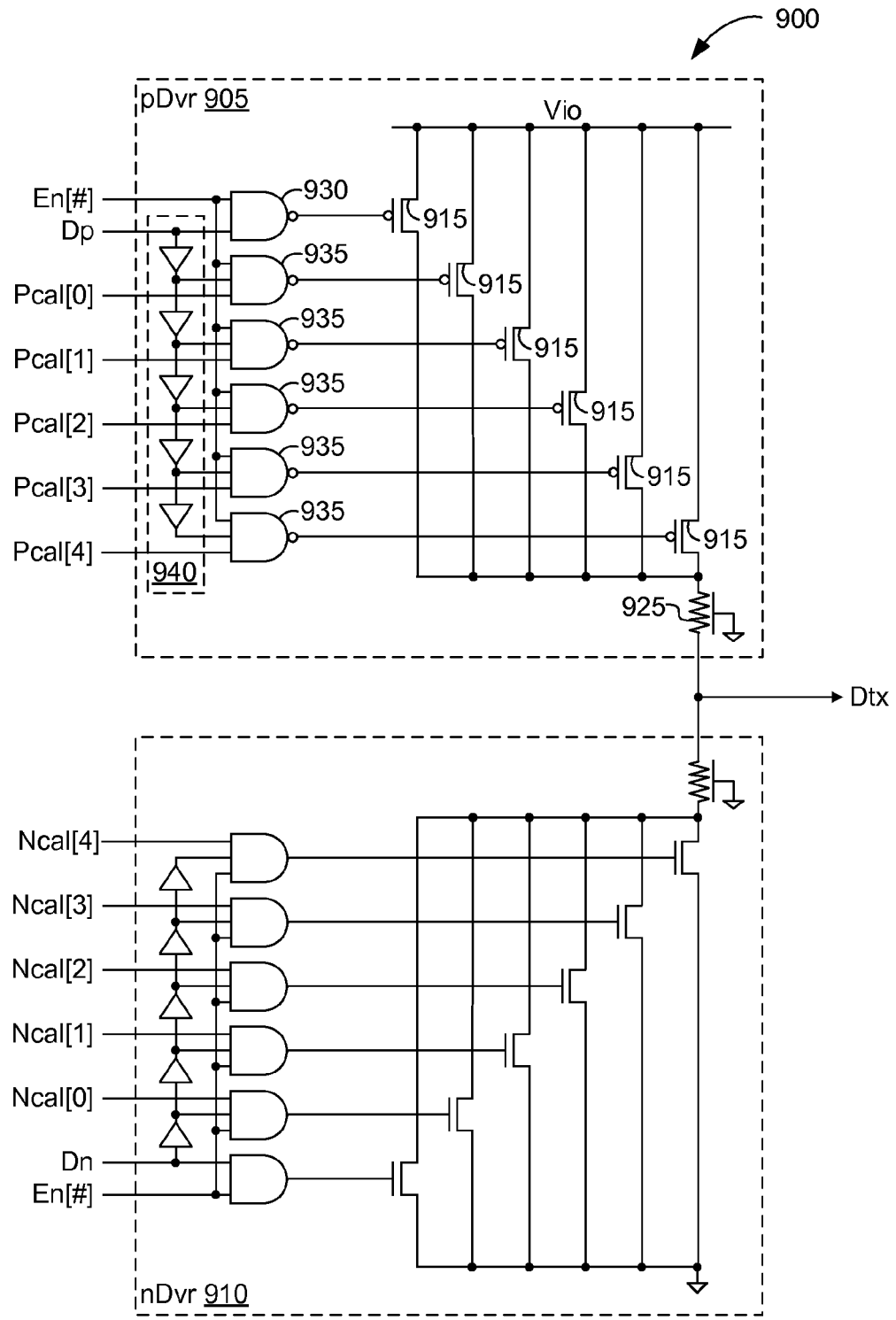
FIG. 9 depicts a driver 900 that can be used in place of each driver of FIG. 8.

FIG. 9 depicts a driver 900 that can be used in place of each driver of FIG. 8. Driver 900 includes a pull-up driver 905 and a pull-down driver 910 coupled in series between first and second supply terminals Vio and ground. The driver output Dtx is taken from the common node between drivers 905 and 910.

Driver 905 includes six PMOS transistors 915 coupled in parallel between nodes Vio and Dtx, but there can be more or fewer, depending upon the desired range and granularity of adjustment. Each PMOS transistor controls the current through a respective resistive path. These resistive paths can be binary-weighted, an area-efficient configuration that produces a large number of potential impedance values. The I-V characteristics of transistors may be somewhat non-linear, and this non-linearity may introduce some non-linearity in the impedance through driver 905. A resistor 925, e.g. of polysilicon, improves the linearity of the impedance through driver 905 over the range of interest. In an embodiment that complies with a stub series-terminated logic (SSTL) interface standard in which Vio may be 1.8 Volts, 2.5 Volts, or 3.3 Volts, the impedances through drivers 905 and 910 can be adjusted over a range of 14-22 Ohms in steps of 0.5 Ohms.

The enable signal En# (e.g., En[0]) controls the topmost transistor 915 via a two-input NAND gate 930 and the remaining transistors 915 via three-input NAND gates 935: when enable En[#] is a zero, each of NAND gates 930 and 935 issues a logic one to the gates of transistors 915, turning them off. If the enable signal is a one, NAND gate 930 turns on the topmost transistor 915 when data signal Dp is a logic one. Those of NAND gates 935 receiving a logic one from the corresponding bit of calibration signal Pcal[0:4] will also enable their corresponding transistors 915 when data signal Dp is a logic one. In the depicted embodiment, a series of buffers 940 delays input signal Dp so enabled transistors 915 are turned on successively to control the slew rate of driver 900. Buffers 940 may exhibit fixed or adjustable delays.

In some embodiments, the core logic used to implement control logic, such as NAND gates 930 and 935, is powered using a supply-voltage level lower than the input/output voltage Vio. Level shifters may therefore be included as need to communicate logic signals between e.g. NAND gates 930 and 935 and transistors 915. The placement and configuration of level shifters is well known to those of skill in the art, and is therefore omitted here for clarity of expression.

Pull-down driver 910 is similar to pull-up driver 905, but uses NMOS transistors in lieu of PMOS and AND gates in lieu of NAND gates. A detailed discussion of driver 910 is omitted for brevity.

Figure 10:
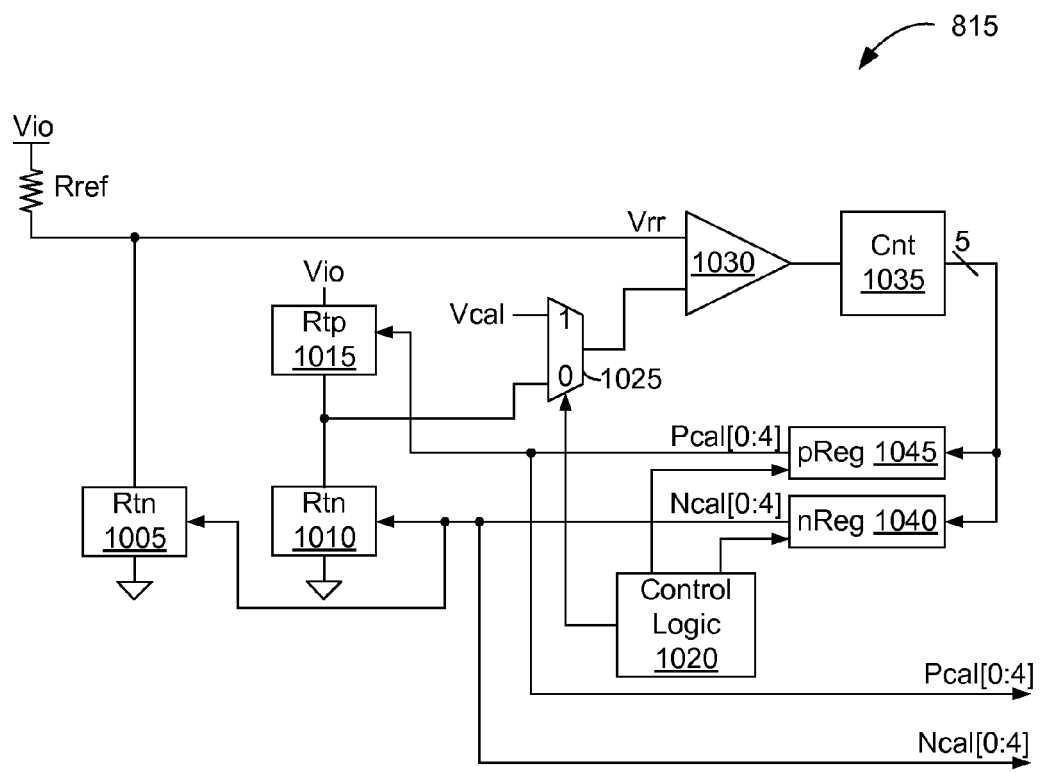
FIG. 10 depicts calibration circuitry 815 of FIG. 8 in accordance with one embodiment.

FIG. 10 depicts calibration circuitry 815 of FIG. 8 in accordance with one embodiment. Calibration circuitry 815 includes two n-type reference impedances 1005 and 1010 and one p-type reference impedance 1015. N-type reference impedances 1005 and 1010 are designed to be identical, or nearly so, to the transistors of pull-down driver 910 depicted in FIG. 9, with the lowermost transistor biased on and the five remaining transistors controlled by calibration signal Ncal[0:4]. The transistors of driver 910 and reference impedances 1005 and 1010 are made using the same process and are subject to similar fluctuations in supply voltage and temperature, and can therefore be expected to exhibit similar impedances in response to the same calibration signal. P-type reference impedance 1015 is designed to be identical, or nearly so, to the transistors of pull-up driver 905 of FIG. 9, with the uppermost transistor biased on and the five remaining transistors controlled by calibration signal Pcal[0:4]. The transistors of driver 905 and reference impedance 1015 are made using the same process and are subject to similar fluctuations in supply voltage and temperature, and can therefore be expected to exhibit similar impedances in response to the same calibration signal.

Calibration circuitry 815 includes some control logic 1020, such as a state machine, that calibrates impedances 1005, 1010, and 1015 by comparison with an external precision reference resistor Rref. To begin with, control logic 1020 causes a multiplexer 1025 to convey a calibration voltage Vcal (e.g., half of Vio) to one terminal of a comparator 1030. The other input terminal of comparator 1030 is coupled between external reference resistor Rref and internal reference impedance 1005. A counter 1035 counts up when voltage Vrr from reference resistor Rref exceeds the calibration voltage Vcal. The contents of counter 1035 is captured in a register 1040 during the pull-down calibration, so that Ncal[0:4] increases with counter 1035. The increased count reduces the value of impedance 1005, and consequently reduces voltage Vrr. Voltage Vrr thus converges on voltage Vcal. In the case in which voltage Vcal is half of voltage Vio, this convergence occurs when the value of impedance 1005 equals that of reference resistor Rref. Impedances 1005 and 1010 are identical, so this procedure calibrates them both.

Once impedances 1005 and 1010 have had sufficient time for calibration, control logic 1020 prevents further updates to register 1040, and thus holds the values of impedances 1005 and 1010. Control logic 1020 then causes multiplexer 1025 to select the node between impedances 1015 and 1010 for comparison to voltage Vrr and enables a second register 1045 to receive the counts from counter 1035. Counter 1035 counts up when the voltage Vrr exceeds the voltage between impedances 1010 and 1015. The contents of counter 1035 is captured in register 1045 during the pull-up calibration, so that Pcal[0:4] increases with counter 1035. The increased count reduces the impedance through impedance 1015, and consequently increases the voltage from multiplexer 1025. The two voltages converge when the value of impedance 1015 equals that of reference resistor Rref. Control logic 1020 then freezes the count within register 1045 until initiating the next calibration sequence.

Figure 11:
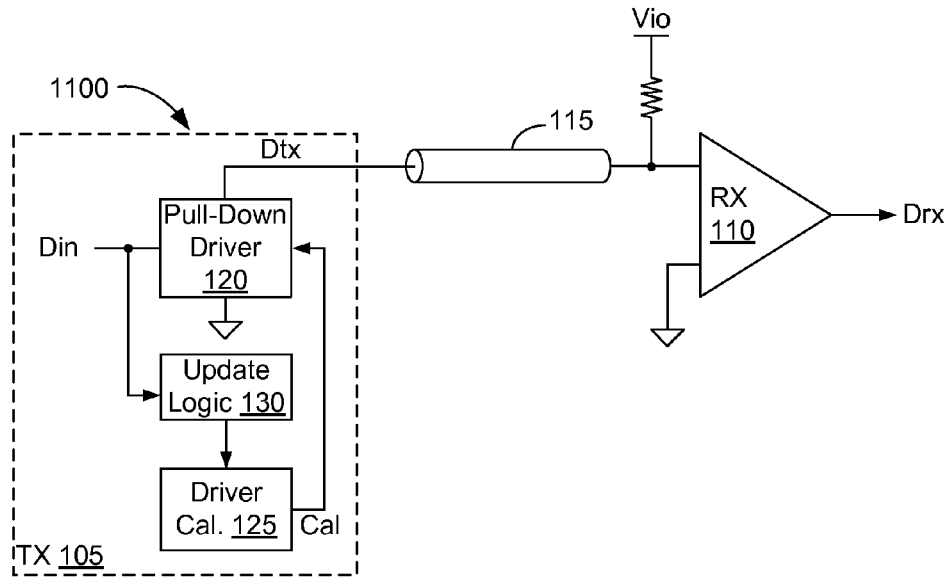
FIG. 11 depicts a communication system 1100 in accordance with another embodiment.

FIG. 11 depicts a communication system 1100 in accordance with another embodiment. System 1100 is in many ways similar to system 100 of FIG. 1, like-identified elements being the same or similar. The operation of system 1100 is sufficiently similar to system 100 that a detailed discussion is unnecessary, and is therefore omitted for brevity.

Figure 12:
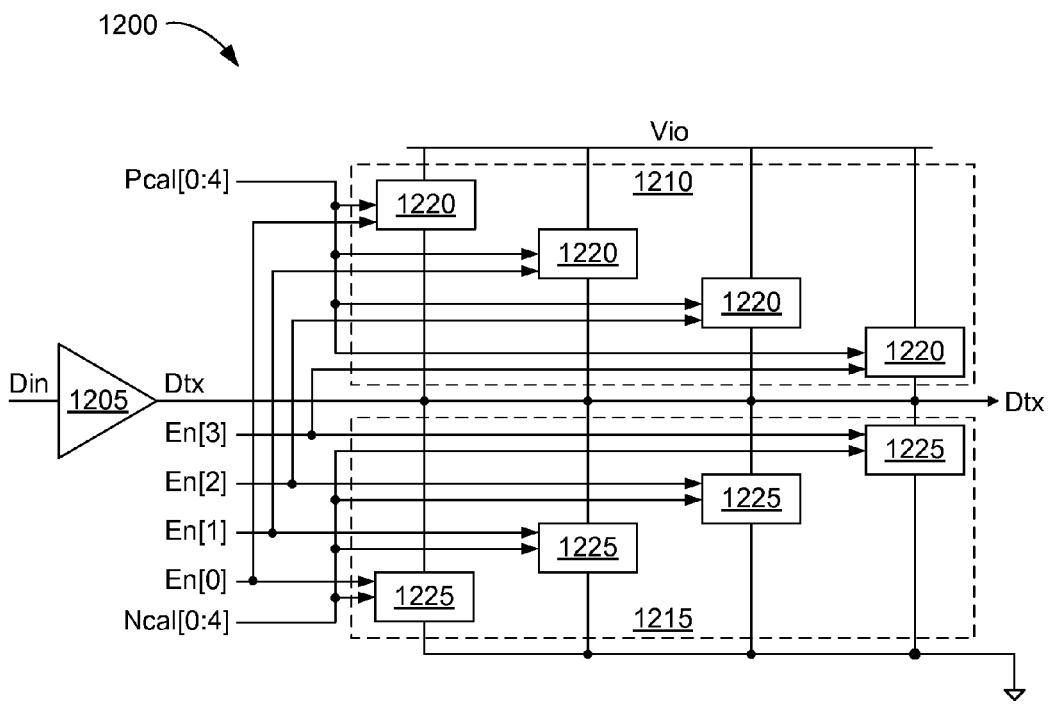
FIG. 12 depicts driver circuitry 1200 in accordance with another embodiment.

FIG. 12 depicts driver circuitry 1200 in accordance with another embodiment. Circuitry 1200 includes an amplifier 1205 and a pair of termination elements 1210 and 1215. Amplifier 1205 can be adaptive, e.g. in the manner of amplifier 700 of FIG. 7. Termination element 1210 includes a number (e.g. four) of sub-elements 1220, each of which may be similar to driver 905 of FIG. 9 but omits data Dp as an input Likewise, element 1215 includes a number (e.g. four) of sub-elements 1225, each of which may be similar to driver 910 of FIG. 9 but omits data Dn as an input. Sub-elements 1220 and 1225 can be adaptively calibrated in the same manners as the drivers detailed above to facilitate ODT calibration that does not interfere or that interferes minimally with data transfer. Circuitry similar to calibration circuitry 815 of FIGS. 8 and 10 can be used to calibrate termination elements 1210 and 1215, though the impedance and reference voltages may be changed as appropriate to establish a desired termination impedance. Calibration circuitry 815 can be modified to support the requisite termination-calibration impedances and voltages such that the calibration sequences for the drivers and termination elements share some of the calibration circuitry (e.g., comparator 1030, counter 1035, and control logic 1020).

Each of the foregoing embodiments support drive calibration schemes that do not interrupt data transfer. Such schemes are useful where uninterrupted transmission is important, and are not limited to data. Clock drivers, used for on-die buffering schemes for example, transmit relatively continuous clock signals and might thus benefit from clock buffers that can be recalibrated without interrupting clock signals. Embodiments that update active clock drivers may differ from those that update active data drivers, however, because the signal pattern conveyed via a clock driver—alternating high and low levels—is known in advance. Inactive pull-up or pull-down drivers of a clock buffer can thus be identified without monitoring the incoming pattern. If, for example, the voltage level transmitted by a clock buffer is low, update logic can assume the pull-up portion of the clock driver is inactive and that the pull-down portion will be inactive in the next clock cycle. The same assumption can be made if the clock buffer transmitted a low voltage level an even number of clock cycles before or after the present clock cycle.

The amplifiers and receivers discussed herein may be instantiated on separate integrated-circuit (IC) dies, each of which may be any of myriad types of processing chips capable of communicating electrical signals. Typical examples include IC dies that communicate via parallel or serial bus interfaces. Communicating devices can use either unidirectional or bidirectional signal lines, as is well known to those of skill in the art. Further, while the depicted embodiment is described in connection with a typical case in which two dies communicate signals via external lines, other embodiments calibrate drivers to improve communication speed between circuits that exist on the same die or between devices that communicate via a wireless channel.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example, (1) the external voltage and resistance references may be substituted in other embodiments with on-chip references; (2) embodiments of the invention can be adapted for use with multi-PAM signals; (3) and clock drivers (either for internal use or transmitting via e.g. an output pad) used for e.g. on-die buffering schemes. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description.

What is claimed is:

1. An amplifier comprising:
    an input node to receive an incoming signal expressing a sequence of symbols, including at least a first symbol type and a second symbol type;
    a first driver coupled to the input node to amplify the incoming signal at a first drive strength, wherein the first driver is active responsive to the first symbol type and inactive responsive to the second symbol type;
    update logic coupled to the input node and to the driver, the update logic to identify a timing window during which the driver will be inactive and to enable updates to the drive strength during the timing window; and
    a second driver coupled to the input node to amplify the incoming signal at a second drive strength, wherein the second driver is inactive responsive to the first symbol type and active responsive to the second symbol type.

2. The amplifier of claim 1, wherein the update logic identifies second timing windows during which the second driver will be inactive and enables updates to the second driver during the second timing windows.

3. The amplifier of claim 1, further comprising driver calibration circuitry coupled to the driver to set the drive strength.

4. An amplifier comprising:
    an input node to receive an incoming signal expressing a sequence of symbols, including at least a first symbol type and a second symbol type;
    a driver coupled to the input node to amplify the incoming signal at a drive strength, wherein the driver is active responsive to the first symbol type and inactive responsive to the second symbol type;
    update logic coupled to the input node and to the driver, the update logic to identify a timing window during which the driver will be inactive and to enable updates to the drive strength during the timing window; and
    a resistor coupled in series with the driver between first and second supply nodes.

5. The amplifier of claim 4, wherein the resistor and the amplifier are instantiated on an integrated circuit.

6. The amplifier of claim 4, wherein the input node, driver, and update logic are instantiated on an integrated circuit device.

7. The amplifier of claim 4, wherein the driver exhibits a low-impedance when active and a high-impedance when inactive.

8. An amplifier comprising:
    signal drivers coupled in parallel between an input node and an output node to drive a data signal, each signal driver including a calibration port;

driver-calibration control circuitry coupled to the calibration ports to convey respective calibration signals to the signal drivers; and update control circuitry coupled to the signal drivers to selectively enable one of the signal drivers and disable another of the signal drivers;

wherein the update control circuitry holds the calibration signal to the enabled signal driver constant while changing the calibration signal to the disabled signal driver to recalibrate the disabled signal driver while the enabled signal driver drives the data signal.

9. The amplifier of claim 8, further comprising update logic coupled to the input node to identify a timing window during which the disabled signal driver is disabled.

10. The amplifier of claim 8, wherein the driver-calibration control circuitry updates the calibration signals responsive to the update control circuitry.

11. The amplifier of claim 8, wherein the signal drivers are push-pull drivers.

12. A method for calibrating an amplifier that includes parallel drivers, the method comprising:

disabling a first of the drivers and enabling a second of the drivers;

calibrating the disabled first driver while amplifying an incoming signal with the enabled second driver, and while holding the calibration of the enabled signal driver constant; and disabling the second of the drivers and enabling the first of the drivers.

13. The method of claim 12, further comprising calibrating the disabled second driver while amplifying the incoming signal with the enabled first driver.

14. The method of claim 12, wherein calibrating the disabled first driver comprises changing a drive strength of the first driver.

15. A method for calibrating an amplifier that includes parallel drivers, the method comprising:

disabling a first of the drivers and enabling a second of the drivers;

calibrating the disabled first driver while amplifying an incoming signal with the enabled second driver;

disabling the second of the drivers and enabling the first of the drivers; and monitoring the incoming signal to identify a timing window during which the second of the drivers will be inactive; and updating the second of the drivers during the timing window.

16. The method of claim 15, wherein the signal represents a sequence of bits, each existing for a bit time, and wherein the timing window exists for longer than one bit time.

17. An amplifier comprising:

an input node to receive an incoming signal expressing a sequence of symbols, each symbol representing one of at least two symbol types;

a driver coupled to the input node to amplify the incoming signal at a drive strength, wherein the driver is active responsive to a first of the symbol types and inactive responsive to a second of the symbol types; and means for updating the drive strength while the amplifier amplifies the incoming signal and the driver is inactive.

18. The amplifier of claim 17, wherein the means for updating the drive strength includes means for identifying timing windows during which the driver will be inactive.

19. The amplifier of claim 18, wherein the means for updating the drive strength changes an impedance of the driver.

20. The amplifier of claim 17, wherein the first of the symbol types represents a logic one and the second of the symbols types represents a logic zero.

* * * * *